(12) United States Patent
Manginell et al.

(10) Patent No.: US 6,930,051 B1
(45) Date of Patent: Aug. 16, 2005

(54) METHOD TO FABRICATE MULTI-LEVEL SILICON-BASED MICROSTRUCTURES VIA USE OF AN ETCHING DELAY LAYER

(75) Inventors: Ronald P. Manginell, Albuquerque, NM (US); W. Kent Schubert, Albuquerque, NM (US); Randy J. Shul, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 440 days.

(21) Appl. No.: 10/165,861

(22) Filed: Jun. 6, 2002

(51) Int. Cl.[7] .......................................... H01L 21/302
(52) U.S. Cl. ...................................... 438/735; 438/712
(58) Field of Search ......................................... 438/735

(56) References Cited

U.S. PATENT DOCUMENTS 5,348,619 A * 9/1994 Bohannon et al. .......... 156/664
5,554,554 A * 9/1996 Bastiani et al. ............... 437/47

OTHER PUBLICATIONS

IBM TDB NB82081402, Aug. 1982, pp 1402-1403.*

* cited by examiner

*Primary Examiner*—Douglas A. Wille
(74) *Attorney, Agent, or Firm*—Brian Dodson; Kevin Bieg

(57) ABSTRACT

New methods for fabrication of silicon microstructures have been developed. In these methods, an etching delay layer is deposited and patterned so as to provide differential control on the depth of features being etched into a substrate material. Structures having features with different depth can be formed thereby in a single etching step.

5 Claims, 1 Drawing Sheet

METHOD TO FABRICATE MULTI-LEVEL SILICON-BASED MICROSTRUCTURES VIA USE OF AN ETCHING DELAY LAYER

GOVERNMENT RIGHTS

This invention was made with Government support under Contract DE-AC04-94AL85000 awarded by the U.S. Department of Energy. The Government has certain rights in the invention.

FIELD OF THE INVENTION

The present invention relates generally to silicon-based microstructure fabrication, and in particular to the use of etching delay layers in fabrication of multi-level silicon-based microstructures.

BACKGROUND OF THE INVENTION

Development of new fabrication technologies for silicon-based microstructures is currently under aggressive pursuit. Silicon-based microstructures commonly comprise silicon and silicon oxides, but can also comprise silicon nitride, metal thin films, and a range of other structural materials known in the art. Such microstructures are commonly fabricated using a range of techniques originally developed for fabrication of silicon integrated circuits, and find application in the area of microelectromechanical systems (MEMS), and in microfluidic systems, such as micro-scale chemical sensors, gas chromatographs, and the like.

It is held desirable in the art to fabricate a desired microstructure so that the number of gross assembly steps is limited. Gross assembly steps are those which provide external functional interconnection between individually fabricated subassemblies. Gross assembly steps require precision handling, positioning, and bonding of delicate millimeter-scale structures, which are fraught with opportunities for failure. In particular, when the goal is a micromechanical device, the bonding materials can easily interfere with the desired motion of the components of the device. Similarly, when the goal is a microfluidic device, the bonding materials can block the flow channels, or prevent microvalves from functioning properly.

Working against the above motivations for direct fabrication of complex microstructures is the difficulty of fabricating such microstructures in their entirety. As the complexity of a process required for fabrication of a desired silicon microstructure increases, the useful yield of that process falls rapidly toward zero. Complex fabrication processes are not only susceptible to error, but in many cases can lead to accumulation of residual stress, nonplanarity, and other structural flaws which can render the desired product unusable.

The etching of features into a silicon-based microstructure plays a central role in the fabrication of micro-scale silicon-based devices. Both wet etching and dry etching are commonly used in such fabrication. Wet etching of silicon is commonly carried out using liquid etchants including, but not limited to, KOH, tetramethyl ammonium hydroxide, or ethylene diamine pyrochatechol. In contrast, dry etching generally comprises the application of reactive neutrals and ionic etchants generated in a plasma to the surface to be etched. Of particular utility in silicon-based microstructural fabrication is deep reactive ion etching.

There is an ongoing need in the art for microstructural fabrication techniques which allow the development of less complex fabrication processes.

The present invention addresses this need by enabling the fabrication of multiple levels of structural definition during the course of a single etching procedure.

These and other advantages of the method of the present invention will become evident to those skilled in the art.

SUMMARY OF THE INVENTION

New methods for fabrication of silicon-based microstructures have been developed. These methods comprise the deposition and patterning of an etching delay layer, whose presence modifies an etching step so as to more precisely control the end product thereof.

BRIEF DESCRIPTION OF THE DRAWINGS

FIG. 1 shows a schematic illustration of various stages in the fabrication of a multi-level microcomponent using the present invention.

DETAILED DESCRIPTION

To etch structural features to different depths in a single etching step, an etching delay layer of a predetermined thickness can be placed over the features for which smaller etching depth is desired. FIG. 1 shows structures resulting in various stages of fabricating structural features with different depths using the present invention.

Figure 1A:
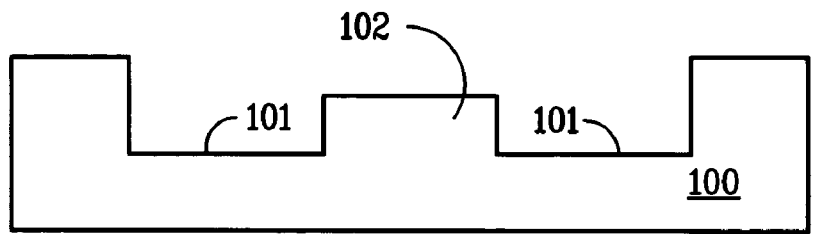
FIG. 1a shows a cross-sectional view of the desired microcomponent.

FIG. 1a shows a desired microcomponent comprising a substrate 100, within which has been defined a well 101 with a central protrusion 102. Assume for clarity that the structure in the illustration is rotationally symmetric about a central vertical axis.

Figure 1B:
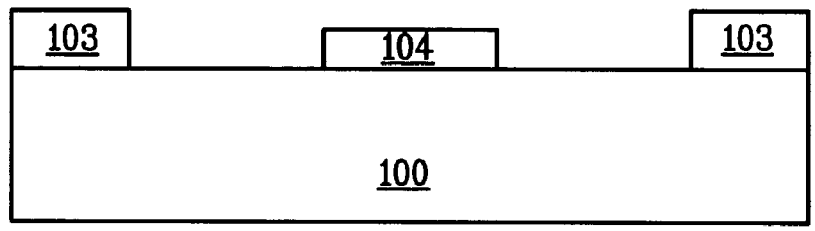
FIG. 1b shows a mask layer and an etching delay layer on a substrate from which the desired microcomponent is to be fabricated.

FIG. 1b shows substrate 100 before the etching process is begun. Mask layer 103 substantially prevents etching from occurring in the region outside of the well 101 to be fabricated. Central protrusion 102 results from limiting the etching action in substrate 100 at the desired location of said central protrusion. This is accomplished by depositing an etching delay layer 104 atop substrate 100 in the desired location of the central protrusion.

When the etching process begins, the surface material not protected by mask layer 103 is removed at a rate characteristic of the material, the etchant, the etching conditions, and the geometry of the pattern being etched. In this example, it is desired to fabricate well 101 with a depth below the original substrate surface of $d_s$, and to fabricate central protrusion 102 with a depth below the original substrate surface of d, with d being smaller than $d_s$. With the etching process to be used, the etching rate for the substrate material is $r_s$, while the etching rate for etching delay layer 104 is $r_d$. In this case, the thickness $d_d$ of etching delay layer 104 is given by the relation $$d_d = (r_d/r_s)d_s - d.$$

The etching delay layer 104 can be made of any of a wide range of materials. Layer 104 can take the form of an inorganic thin film, such as silicon, silicon oxide, silicon nitride, alumina, and many others. Layer 104 can also take the form of an organic layer, typically comprising a polymer, which is susceptible to the etching process to be used.

Figure 1C:
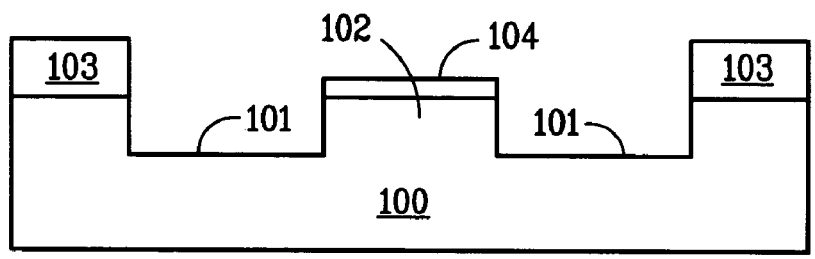
FIG. 1c shows a structure during the early stages of etching, before the etching delay layer has been removed.

FIG. 1c shows the structure produced following a short period of etching. Well 101 is now well defined in substrate 100. However, although etching delay layer 104 is somewhat thinned by the etchant, central protrusion 102 has not yet been etched into the material of substrate 100.

Figure 1D:
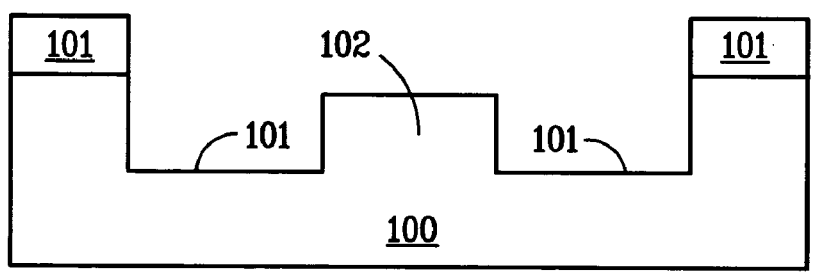
FIG. 1d shows a structure later during the etching process, at the point where the etching delay layer has been removed, and the difference in etching depth established.

FIG. 1d shows the structure at a later stage of etching. Well 101 is quite deep at this point. Etching delay layer 104 has been removed entirely, while central protrusion 102 has just begun to be etched to a level below the original substrate surface.

Figure 1E:
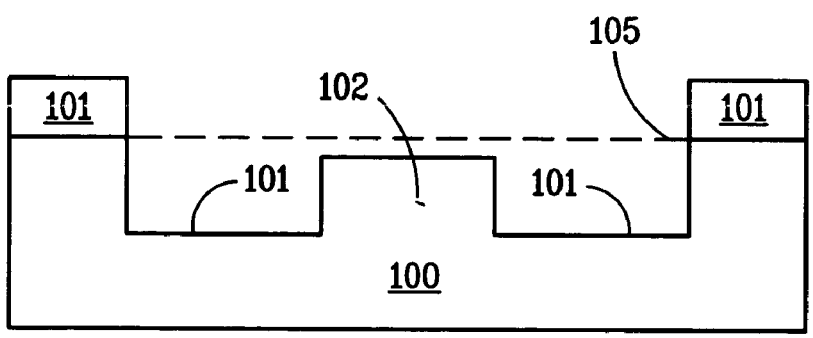
FIG. 1e shows attainment of the desired structure after subsequent etching.

FIG. 1e shows the structure at the end of the etching process. Here both well 101 and central protrusion 102 have the desired depths below the original substrate surface 105, and have been produced in a single etching step.

The specific implementations of the present invention described above are intended only to illustrate various features of the present invention. The scope of the present invention is intended to be set by the claims in view of the specification.

What is claimed is:

1. A method for fabrication of silicon-based microstructures, comprising the deposition and patterning of an etching delay layer on a surface of a substrate, and further comprising an etching process, the thickness and location of said etching delay layer being chosen to control the depth of features formed in the surface of the substrate after said etching delay layer is removed and the substrate is etched by said etching process.

2. The method of claim 1, wherein said etching delay layer comprises an organic thin film.

3. The method of claim 2, wherein said organic thin film comprises a polymer.

4. The method of claim 1, wherein said etching delay layer comprises an inorganic thin film.

5. The method of claim 1, wherein some of said features are formed with a depth differing from the depth of other of said features.

* * * * *